US006405057B1

United States Patent
Wright

(10) Patent No.: US 6,405,057 B1
(45) Date of Patent: Jun. 11, 2002

(54) METHOD AND APPARATUS FOR BASE TRANSCEIVER STATION COLD STARTS

(75) Inventor: Jonathan Wright, Irving, TX (US)

(73) Assignee: Nokia Telecommunications, oY, Espoo (FI)

( * ) Notice: Subject to any disclaimer, the term of this patent is extended or adjusted under 35 U.S.C. 154(b) by 0 days.

(21) Appl. No.: 09/161,940

(22) Filed: Sep. 28, 1998

(51) Int. Cl.$^7$ .............................. A04B 1/38; H04M 1/00; H04Q 7/20; H03F 3/04
(52) U.S. Cl. ...................... 455/561; 455/127; 455/522; 330/296; 330/298
(58) Field of Search .................................. 455/561, 550, 455/127, 522, 73, 507, 517, 115, 117, 310, 226.1, 91; 330/296, 289, 298

(56) References Cited

U.S. PATENT DOCUMENTS 5,920,808 A * 7/1999 Jones et al. .................. 455/127
6,043,712 A * 3/2000 Leizerovich et al. .... 330/298 X

FOREIGN PATENT DOCUMENTS

EP          0 390 360 A2    10/1990
WO          WO 84/01243     3/1984

OTHER PUBLICATIONS

Patent Abstract for Japanese Patent No. 05292002, published May 11, 1993.

* cited by examiner

Primary Examiner—Tracy Legree
(74) Attorney, Agent, or Firm—Altera Law Group, LLC

(57) ABSTRACT

A method and apparatus for maintaining component temperature in a base station is disclosed. The method and apparatus reduces or eliminates the time required for raising the internal temperature of components in a base station transceiver without incurring substantial cost. A power amplifier receives a signal at an input and provides an amplified signal at an output and a switch for switching between a first and a second bias circuit in response to a control signal, wherein the first bias circuit comprises an RF bias circuit for providing normal RF bias to the power amplifier and the second bias circuit is a cold start bias circuit for providing a cold start bias to the power amplifier. The power amplifier includes a power transistor. The cold start bias circuit causes the power transmitter to substantially increase an amount of heat dissipated by the power amplifier causing the temperature of the BTS to rise above de-ratings for the components. The temperature monitor also compares a measured temperature to a minimum and a maximum reference temperature. The temperature monitor provides a signal for engaging the switch causing the cold start bias circuit to be selected by the switch when the measured temperature is less than the minimum reference temperature and a signal for disengaging the switch causing the RF bias circuit to be selected by the switch when the measured temperature is greater than the minimum reference temperature.

17 Claims, 3 Drawing Sheets

METHOD AND APPARATUS FOR BASE TRANSCEIVER STATION COLD STARTS

BACKGROUND OF THE INVENTION

1. Field of the Invention

This invention relates in general to transceivers for communication systems, and more particularly to a method and apparatus for maintaining component temperature in a base transceiver station (BTS).

2. Description of Related Art

The telecommunications industry is in the midst of its most dramatic set of changes since the analog telephone system was introduced more than 100 years ago. Deregulation, the Internet and new technology are reshaping the market. Users may not choose between multiple service providers; digital technology is pervasive; and new data services are fueling overall growth for telecommunications services. Further, data services such as dial-up Internet access, digital private lines and even some virtual private network services are typically offered at a fixed price. In some cases this results in a great value for the customer. Such growth is fueling many research programs and expanding the technology opportunities for all manufacturers.

The worldwide third-generation (3G) mobile communications standards being developed by the International Telecommunications Union, through its International Mobile Telecommunications 2000 initiative, are expected to not only provide for global roaming among multiple countries and networks, but also for a smorgasbord of compute-intensive and signal processing-intensive services, delivered at data rates of up to 2 Mbits/second. These services may include full-motion video, Web browsing and video-conferencing, as well as the more pedestrian fax, e-mail access and paging services associated with second-generation systems.

Wireless carriers are hoping the new competition will help the market grow. Currently, about 53 million people subscribe to wireless services. However, the important thing to consumers is that they have access to communications they can count on. End users want to really know that they can count on their communications devices and the wireless networks.

One problem encountered with wireless networks is cold starts for the base station. Within a base station, a transceiver is used for transmitting and receiving user signals. The transceiver includes many components for processing user calls and for controlling the calls. The power amplifier provides a fundamental function of the base station in a wireless communications system. The signal level must be amplified enough to overcome the inherent losses during wireless transmission so that it can be received by the mobile stations or handsets. The design requirements for RF power amplifiers include high output power and good efficiency.

The main purpose of the power amplifier is to deliver power into the antenna as efficiently as possible. Accordingly, power amplifiers are normally biased to most effectively deliver the power to the antenna, and therefore do not generate any heat which is not necessary for the accomplishment of this task. Often, in fact, amplifiers are fitted with large heat-sinks or external cooling systems to prevent heat building up which may damage the power amplifier as well as the other components.

Nevertheless, in a base station environment, temperature considerations are often reversed. For example, base stations are subjected to outside temperatures that often cause the interior temperature, and consequently the temperature of the components themselves, to fall below minimum temperature de-ratings. Because of the minimum temperature de-ratings on the components used in the BTS, the BTS has to be pre-heated prior to being fully commissioned and operational.

Accordingly, the current solution is to heat the internal air in the base station. This in turn heats up the surrounding metal casings and the internal temperature of the BTS and components is increased. Once the components have reached a suitable temperature, the base station is then ready to be commissioned.

However, the process of raising the internal temperature of the components is a very lengthy process. Often, internal printed-circuit board (PCB) mounted heating elements, flexible heating pads or hot air blowers are used. Nevertheless, the cost of such solutions are substantial.

It can be seen that there is a need for a method and apparatus that reduces or eliminates the time required for raising the internal temperature of components in a base station transceiver.

It can also be seen that there is a need for a method and apparatus that raises the internal temperature of components in a base station transceiver without incurring substantial cost.

SUMMARY OF THE INVENTION

To overcome the limitations in the prior art described above, and to overcome other limitations that will become apparent upon reading and understanding the present specification, the present invention discloses a method and apparatus for maintaining component temperature in a base station transceiver.

The present invention solves the above-described problems by providing a method and apparatus that reduces or eliminates the time required for raising the internal temperature of components in a base station transceiver without incurring substantial cost.

A base station transmitter in accordance with the principles of the present invention includes power amplifier for receiving a signal at an input and providing an amplified signal at an output and a switch, coupled to the input of the power amplifier, for switching between a first and a second bias circuit in response to a control signal, wherein the first bias circuit comprises an RF bias circuit for providing normal RF bias to the power amplifier and the second bias circuit is a cold start bias circuit for providing a cold start bias to the power amplifier.

Other embodiments of a system in accordance with the principles of the invention may include alternative or optional additional aspects. One such aspect of the present invention is that the power amplifier comprises a power transistor.

Another aspect of the present invention is that the base station transmitter further includes bias elements coupled to the power transistor for controlling the gain and frequency response of the power transistor.

Another aspect of the present invention is that the base station transmitter further includes a plurality of components and wherein the cold start bias circuit causes the power transmitter to substantially increase an amount of heat dissipated by the power amplifier to heat the components above temperature de-ratings for the components.

Another aspect of the present invention is that the base station transmitter further includes a temperature monitor and a plurality of components, the temperature monitor comparing a measured temperature to a minimum and a maximum reference temperature.

Another aspect of the present invention is that the temperature monitor provides a signal for engaging the switch causing the cold start bias circuit to be selected by the switch when the measured temperature is less than the minimum reference temperature.

Another aspect of the present invention is that the temperature monitor provides a signal for disengaging the switch causing the RF bias circuit to be selected by the switch when the measured temperature is greater than the minimum reference temperature.

These and various other advantages and features of novelty which characterize the invention are pointed out with particularity in the claims annexed hereto and form a part hereof However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings which form a part hereof, and in which is shown by way of illustration the specific embodiment in which the invention may be practiced. It is to be understood that other embodiments may be utilized as structural changes may be made without departing from the scope of the present invention.

The present invention provides a method and apparatus for maintaining component temperature in a base station transceiver. The method and apparatus reduces or eliminates the time required for raising the internal temperature of components in a base station transceiver without incurring substantial cost.

Figure 1:
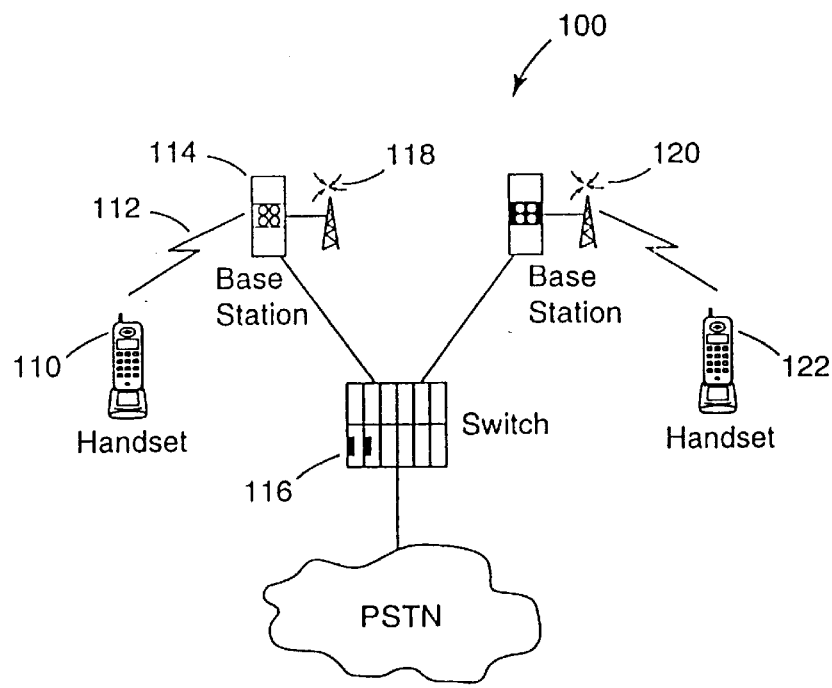
FIG. 1 illustrates a wireless telecommunication system.

FIG. 1 illustrates a wireless telecommunication system 100. This system can be broken down to blocks as shown in FIG. 1. The human voice fed to the microphone of a mobile station or handset 110 is transmitted through the atmosphere 112 to the base station 114. From the base station 114, the signal is routed to a switching center 116 or rebroadcast 118. Similarly, at the network end the voice information is transmitted from the base station 120 and received by the mobile station or handset 122. Each mobile station 110, 112 and base station 114, 120 have the transmitter/receiver (transceiver) function.

Figure 2:
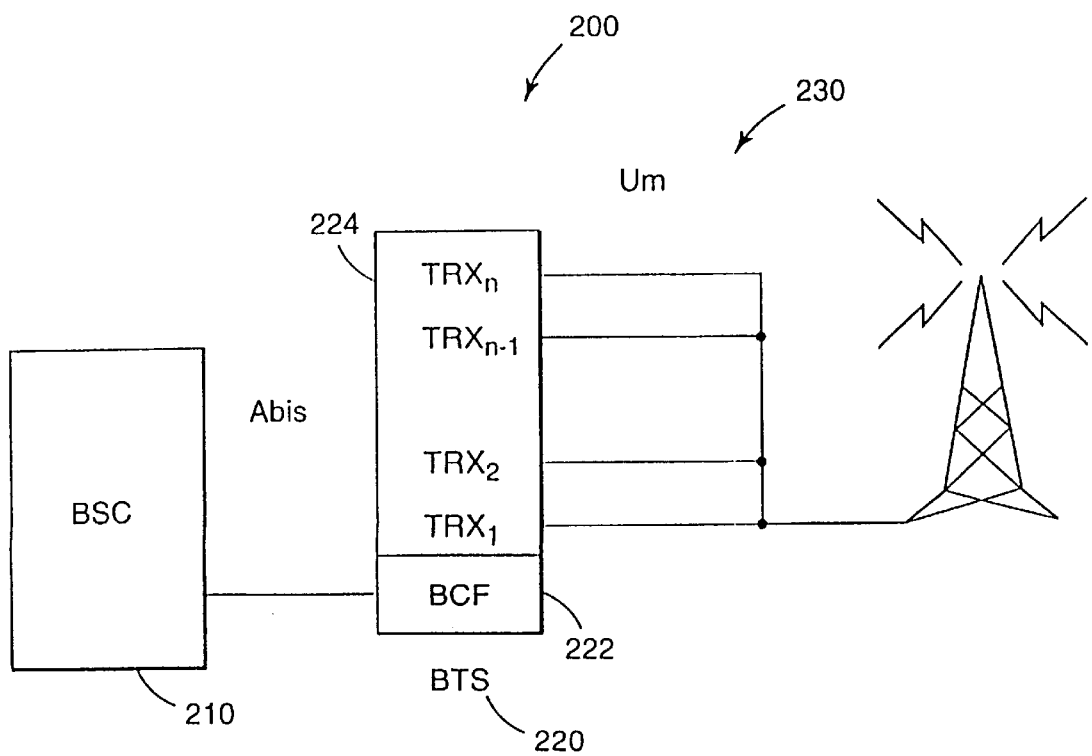
FIG. 2 illustrates the structure of a base station according to the present invention.

FIG. 2 illustrates the structure of a base station 200 according to the present invention. The base station 200 includes a base station controller 210 and a base transceiver station 220. The base transceiver station 220 includes a base station control function 222 and a plurality of transceivers (TRX$_n$) 224. The base station control function 222 provides software administration and the necessary control via appropriate operation and management functions. A transceiver 224 is the object of all of this control effort. The transceiver 224 provides the frequency control for the air interface 230. The transceiver 224 includes a transmitter (not shown) which contains the output filters to band-limit the signals that should not disturb other radio services. The transmitter 224 also controls the output level via a power amplifier as described in further detail herein below.

Figure 3:
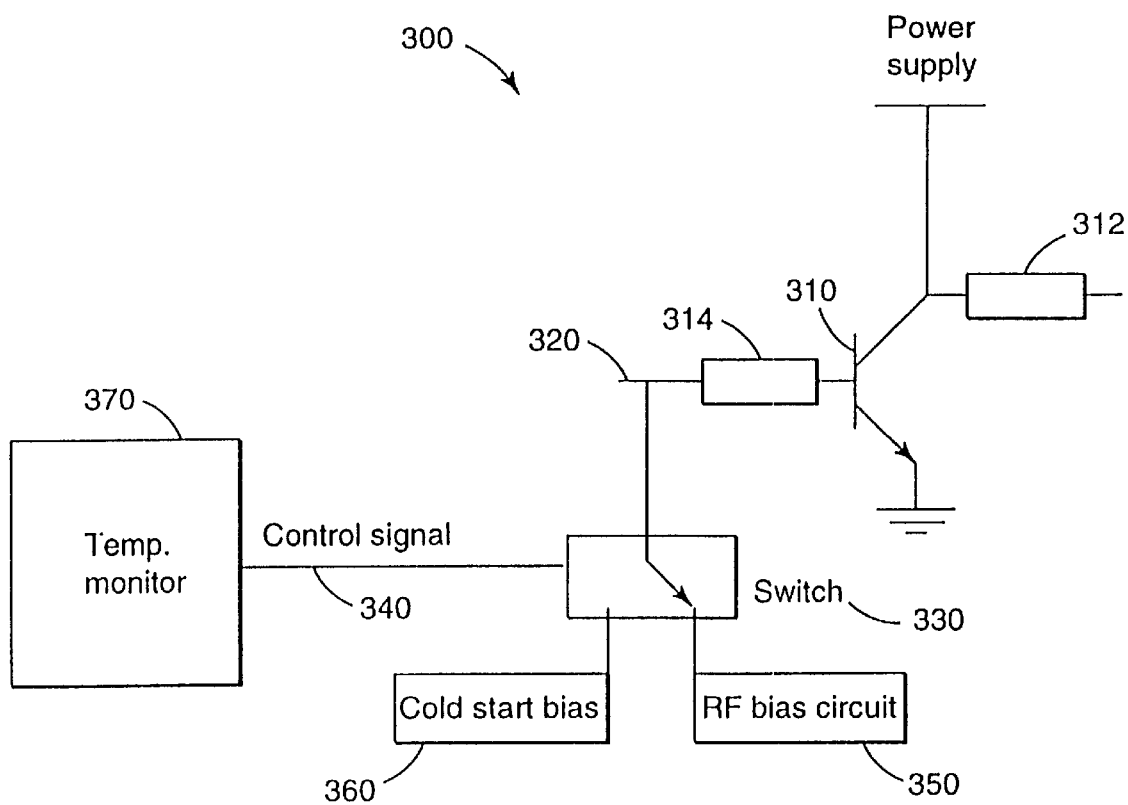
FIG. 3 illustrates a power amplifier of a transceiver according to the present invention.

FIG. 3 illustrates a power amplifier 300 of a transceiver according to the present invention. In FIG. 3, the power transistor 310 is matched to some impedance, normally 50 Ω, by matching networks 312, 314. Those skilled in the art will recognize that the power transistor 310 is illustrated in FIG. 3 as a bipolar junction transistor (BJT) operating in a common emitter mode. However, the present invention is not meant to be limited to the particular embodiment illustrated in FIG. 3, but rather is applicable to any type of transistor and any type of technology, e.g., Laterally Diffused Metal Oxide Silicon. (LDMOS) or Gallium Arsenide (GaAs), operating in any mode.

At the base 320 of the power transistor 310, a switch 330 is coupled thereto. The switch 330 receives control signals 340 for controlling the position of the switch 330. The switch 330 under control of the control signals 340 selects one of two bias positions. A first bias position includes an RF bias circuit 350 for providing normal RF bias to the power transistor 310. A second bias position includes a cold start bias circuit 360 for providing a cold start bias to the power transistor 310.

Under cold start conditions, the switch 330 is activated and the RF power transistor 310 is biased in such a way that the power transistor 310 remains in the DC safe operating area (SOAR). For example, a typical 75 watt RF power transistor may dissipate as much as 120 watts of heat and still be within the 25° C. junction DC SOAR. In other words, the power transistor 330 is run in a class A mode to generate additional heat for raising the internal temperature of the other transceiver components (not shown). This allows the use of industrial grade components, which educes the cost of the transceiver.

The control signal 340 is provided by a temperature monitoring device 370. Hysteresis is built into the sensing of the temperature of the ambient air or the temperature of the other components so that the switch does not exhibit a high duty cycle.

Figure 4:
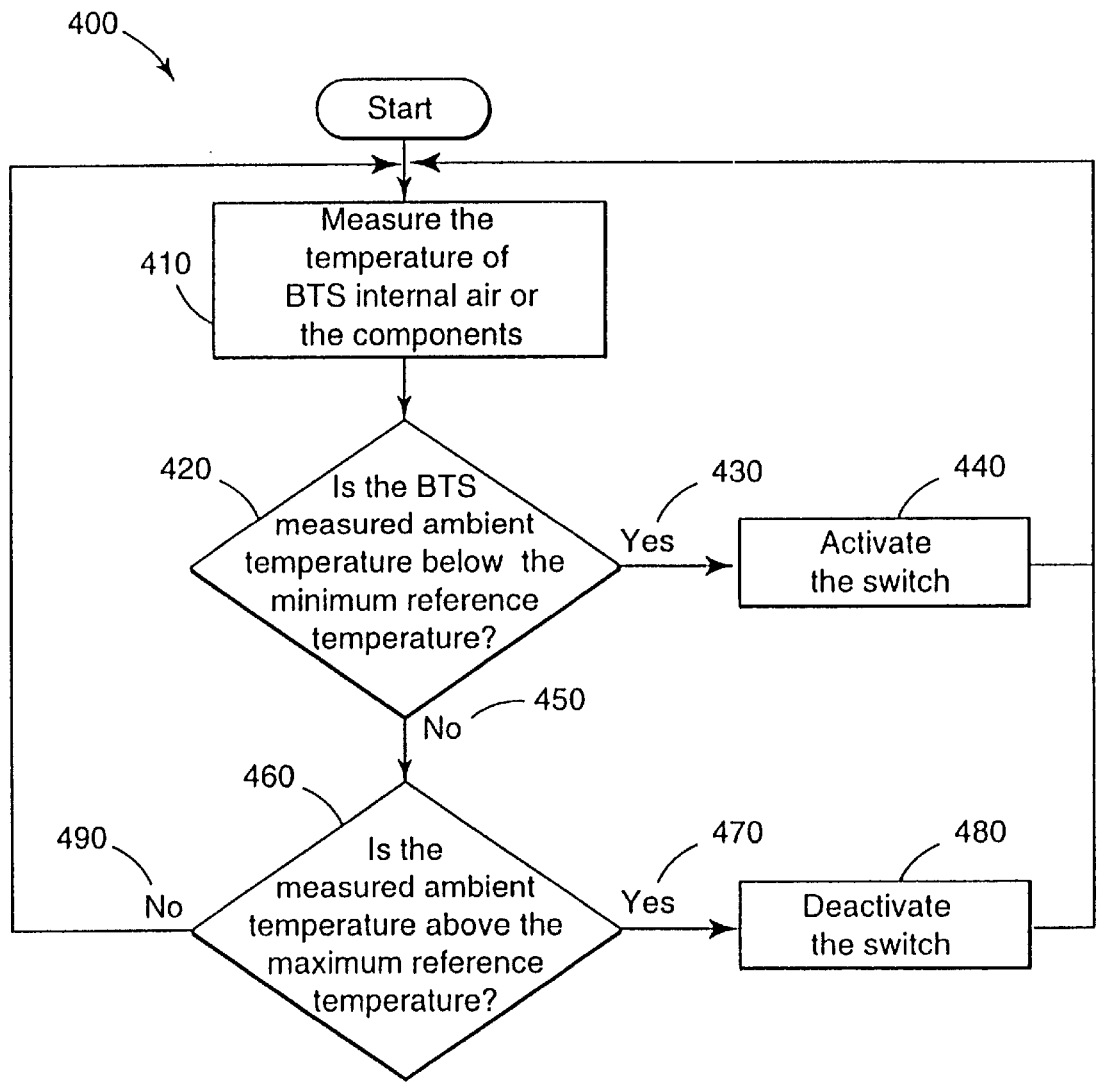
FIG. 4 is a flow chart of the cold start method according to the present invention.

FIG. 4 is a flow chart of the cold start method 400 according to the present invention. A temperature measurement is first made 410. For example, The temperature of the ambient air or the temperature of the other components is measured. The measured temperature is compared to a minimum reference temperature 420. When the measured temperature falls below the minimum reference temperature 430, the control signal activates the switch 440 so the power transistor is biased to generate heat for raising the internal temperature of the BTS.

If the measured ambient temperature is not below the minimum reference temperature 450, the measured temperature is compared to a maximum reference temperature 460. When the measured temperature rises above the maximum reference temperature 470, the control signal deactivates the switch 480 so that the temperature does not rise any higher thereby possibly causing damage to the components, including the power transistor. If the measured temperature is not above the maximum reference temperature 490, the procedure is repeated.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A base station transmitter, comprising:
   a power amplifier for receiving a signal at an input and providing an amplified signal at an output; and
   a switch, coupled to the input of the power amplifier, for switching between a first and a second bias circuit in response to a control signal, wherein the first bias circuit comprises an RF bias circuit for providing normal RF bias to the power amplifier and the second bias circuit is a cold start bias circuit for biasing a power transistor to dissipate heat to increase an operating temperature for surrounding components.

2. The base station transmitter of claim 1 wherein the power amplifier comprises a power transistor.

3. The base station transmitter of claim 2 further comprising bias elements coupled to the power transistor for controlling the gain and frequency response of the power transistor.

4. The base station transmitter of claim 1 further comprising a plurality of components and wherein the cold start bias circuit causes a power transistor to dissipate sufficient heat to heat the components above temperature de-ratings for the components.

5. The base station transmitter of claim 1 further comprising a temperature monitor and a plurality of components, the temperature monitor comparing a measured temperature to a minimum and a maximum reference temperature.

6. The base station transmitter of claim 5 wherein the temperature monitor provides a signal for engaging the switch causing the cold start bias circuit to be selected by the switch when the measured temperature is less than the minimum reference temperature.

7. The base station transmitter of claim 5 wherein the temperature monitor provides a signal for disengaging the switch causing the RF bias circuit to be selected by the switch when the measured temperature is greater than the minimum reference temperature.

8. A base station, comprising:
   a base station controller for controlling the operation of the base station;
   a base transceiver station, the base transceiver station including a base station control function and a transceiver, the transceiver further comprising:
   a power amplifier for receiving a signal at an input and providing an amplified signal at an output; and
   a switch, coupled to the input of the power amplifier, for switching between a first and a second bias circuit in response to a control signal, wherein the first bias circuit comprises an RF bias circuit for providing normal RF bias to the power amplifier and the second bias circuit is a cold start bias circuit for biasing a power transistor to dissipate heat to increase an operating temperature for surrounding components; and
   an antenna for propagating the amplified signal over the air interface.

9. The base station of claim 8 wherein the power amplifier comprises a power transistor.

10. The base station of claim 9 further comprising bias elements coupled to the power transistor for controlling the gain and frequency response of the power transistor.

11. The base station of claim 8 further comprising a plurality of components and wherein the cold start bias circuit causes a power transistor to dissipate sufficient heat to heat the components above temperature de-ratings for the components.

12. The base station of claim 8 further comprising a temperature monitor and a plurality of components, the temperature monitor comparing a measured temperature to a minimum and a maximum reference temperature.

13. The base station of claim 12 wherein the temperature monitor provides a signal for engaging the switch causing the cold start bias circuit to be selected by the switch when the measured temperature is less than the minimum reference temperature.

14. The base station of claim 12 wherein the temperature monitor provides a signal for disengaging the switch causing the RF bias circuit to be selected by the switch when the measured temperature is greater than the minimum reference temperature.

15. A method of maintaining a temperature of components in a base station above temperature de-ratings of the components, comprising:
   measuring a temperature associated with a transceiver;
   causing a power transistor to generate a substantial increase in dissipated heat when the measured temperature is below a predetermined minimum threshold to increase an operating temperature for surrounding components associated with the transceiver; and
   operating the power transistor in a normal RF bias mode when the measured temperature is not below a predetermined minimum threshold.

16. The method of claim 15 further comprising comparing the measured temperature to a minimum threshold and switching to a cold start bias mode for the power transistor to begin generating a substantial increase in the dissipated heat when the measured temperature is less than the minimum threshold.

17. The method of claim 15 further comprising comparing the measured temperature to a maximum threshold and switching to a normal RF bias mode for the power transistor when the measured temperature is greater than the maximum threshold.

* * * * *